United States Patent [19]
Yu-Hong

[11] Patent Number: 6,118,984
[45] Date of Patent: Sep. 12, 2000

[54] DUAL CONVERSION RADIO FREQUENCY TRANSCEIVER

[75] Inventor: Hsueh Yu-Hong, Taoyuan, Taiwan

[73] Assignee: Acer Peripherals, Inc., Taoyuan, Taiwan

[21] Appl. No.: 08/835,449

[22] Filed: Apr. 8, 1997

[51] Int. Cl.[7] .................................................. H04B 1/40
[52] U.S. Cl. .............................................. 455/76; 455/86
[58] Field of Search ................................ 455/76, 78, 84, 455/85, 86, 552, 180.1, 188.1

[56] References Cited

U.S. PATENT DOCUMENTS

| | | | |
|---|---|---|---|
| 4,520,474 | 5/1985 | Vilmur | 455/76 |
| 4,542,531 | 9/1985 | Fukumura | 455/86 |
| 5,825,813 | 10/1998 | Na | 455/76 |

*Primary Examiner*—Nguyen Vo
*Attorney, Agent, or Firm*—Winston Hsu

[57] ABSTRACT

The present invention discloses a dual conversion RF transceiver which uses only one local oscillator for signal conversion to simplify system complexity and reduce production cost. The transceiver comprises a mixer for mixing input RF signals with first local oscillator signal to generate a first IF signal, an IF filter for filtering the first IF signal, a local oscillator for providing second local oscillator signal, a demodulator for demodulating the filtered first IF signal into first baseband signals by using the second oscillator signal, a baseband circuit for processing the first baseband signals and generating second baseband signals to be transmitted, a modulator for modulating the second baseband signals into a second IF signal by using the second local oscillator signal, and a frequency multiplier for multiplying the frequency of the second IF signal by a predetermined factor to generate a output RF signal. When the transceiver starts receiving the RF signals, the baseband circuit will produce a fixed baseband signal which will be modulated into fixed frequency signal by the modulator by using the second local oscillator signal. And the frequency of the fixed frequency signal will be multiplied by the frequency multiplier to generate the first local oscillator signal.

10 Claims, 3 Drawing Sheets

DUAL CONVERSION RADIO FREQUENCY TRANSCEIVER

BACKGROUND OF THE INVENTION

1. Field of the Invention

The present invention relates to a radio frequency transceiver, and more particularly, to a radio frequency transceiver used in a wireless digital telephone for transmitting and receiving radio frequency signals.

2. Description of the Prior Art

Many wireless digital telephones use dual conversion transceivers to transmit and receive RF (radio frequency) signals. Most dual conversion transceivers require two local oscillators to generate two different local oscillator signals for modulating and demodulating signals. Two prior art dual conversion transceivers are described in FIGS. 1 and 2.

Please refer to FIG. 1. FIG. 1 shows a system block diagram of a prior art radio frequency transceiver 10 which comprises two local oscillators 140 and 150. The transceiver 10 comprises an antenna 101 for transmitting and receiving RF signals, a duplexer 102 for filtering out noises and interference signals contained in the received RF signal and for matching impedances between the antenna 101 and the follow-on circuits, a LNA (low noise amplifier) 111 for amplifying the filtered RF signal, a front end filter 112 for filtering out noises contained in the amplified RF signal, a mixer 113 for mixing the filtered RF signal from the front end filter 112 with a first local oscillator signal from the first local oscillator 140 to generate an IF (intermediate frequency) signal, an IF filter 114 for filtering out spurious signals contained in the IF signal, and a demodulator 120 for demodulating the filtered IF signal from the IF filter 114 by using second local oscillator signal from the second local oscillator 150 into baseband signals which will be outputted over port 124 for internal processing.

The transceiver 10 further comprises a modulator 10 for modulating baseband signals inputted from ports 191 and 192 into an IF signal by using the second local oscillator signal from the second local oscillator 150, an IF filter 170 for filtering out spurious signals contained in the IF signal, a mixer 171 for modulating the filtered IF signal from the IF filter 170 into a RF signal by using the first local oscillator signals from the first local oscillator 140, a RF filter 172 for filtering out spurious signals contained in the RF signal from the mixer 171, and a power amplifier 173 for amplifying the filtered RF signal. The amplified RF signal are passed to the duplexer 102 for filtering out high order harmonic frequencies caused by nonlinear distortion of the power amplifier 173 and then transmitted by the antenna 101.

The demodulator 120 is a conventional quadrature demodulator and the modulator 160 is a conventional I/Q modulator. The modulator 160 includes a 90 degree phase shifter 163 for shifting the phase of the second oscillator signal from the second oscillator 150, an I mixer 161 for mixing the I baseband signal inputted from port 191 with the output of the phase shifter 163, a Q mixer 162 for mixing the Q baseband signal inputted from port 192 with the second oscillator signal, and an adder 164 for adding the outputs of the I mixer 161 and Q mixer 162 to generate the IF signal.

The first local oscillator 140 used for generating the first oscillator signal comprises a VCO (voltage controlled oscillator) 141 and a PLL (phase locked loop) 142. The PLL 142 is used for frequency stabilization and for input/output frequency switching according to control signals from port 144 when transmitting or receiving RF signals. The second local oscillator 150 used for generating the second local oscillator signal comprises a VCO 151 and a PLL 152. The PLL 152 is used to stabilize frequency of the second local oscillator 150 and to provide input and output frequency switching function according to control signals inputted from port 154.

A crystal oscillator (TCXO) 155 is used as a stable signal source for supplying reference signals to PLLs 142 and 152. Port 144 of the PLL 142 and port 154 of the PLL 152 are connected to a control unit (not shown) which is used to control signal transmitting and receiving of the transceiver 10.

The transceiver 10 further comprises a power amplifier control circuit 180 having a port 193 connected to the control unit for turning on the power amplifier 173 when the transceiver 10 is transmitting signals.

Please refer to FIG. 2. FIG. 2 shows a system block diagram of another prior art radio frequency transceiver 20 which comprises two local oscillators 240 and 250. The transceiver 20 comprises an antenna 201 for transmitting and receiving RF signals, a front end circuit 202 for filtering out noises and various interference signals from the received RF signal and for matching impedance between the antenna 201 and the follow-on circuits. The RF signal received by the antenna 201 will be passed though a switch 203 and the front end circuit 202 to a low noise amplifier 211 for signal amplification, and then inputted to a front end filter 212 for filtering out noises contained in the received RF signal. A mixer 213 is used for mixing the RF signal from the front end filter 212 with first local oscillator signal from the first local oscillator 240 to convert the RF signal into an IF signal. The IF signal will pass through an IF filter 214 for filtering out spurious signals generated by the mixer 213 in the signal mixing process. And a demodulator 220 will demodulate the filtered IF signal from the IF filter 214 by using second oscillator signal from the second local oscillator 250 into baseband signals which will be outputted over port 224 for further internal processing.

The transceiver 20 further comprises a modulator 260 for modulating baseband signals to be transmitted into an IF signal by using the second oscillator signal from the second local oscillator 250, a frequency multiplier 270 for converting the IF signal into a RF signal by using the first local oscillator signal from the first local oscillator 240, and a power amplifier 283 for amplify the RF signal. The RF signal generated by the frequency multiplier 270 require no filtering because the frequency multiplier 270 is an active feed back loop which can stably and accurately performs the frequency conversion work. The amplified RF signal outputted from the power amplifier 283 will be passed to the switch 203 and then transmitted by the antenna 201.

The demodulator 220 is a conventional quadrature demodulator. The modulator 260 is the same as the modulator 160 shown in FIG. 1. And the first and second local oscillators 240 and 250 are identical to the two local oscillators 140 and 150 shown in FIG. 1. A crystal oscillator (TCXO) 255 is used as a stable signal source for supplying reference signals to PLLs 242 and 252, and port 244 of the PLL 242 and port 254 of the PLL 252 are connected to a control unit (not shown) which is used to control signal transmitting and receiving of the transceiver 20.

The transceiver 20 further comprises a power amplifier control circuit 280 which includes a port 293 connected to the control unit for turning on the power amplifier 283 when the transceiver 20 is transmitting signals. The switch 203 also includes a port 235 connected to the control unit for controlling input and output of RF signals to and from the antenna 201.

The difference between the transceiver 10 and the transceiver 20 is that the frequency multiplier 270 of the transceiver 20 is an active feedback frequency multiplier which is very similar to a frequency synthesizer and is used for changing frequencies. The frequency multiplier 270 comprises a mixer 272 for mixing the first oscillator signal from the first oscillator 240 with the RF signal outputted from the frequency multiplier 270, a phase comparator 274 for detecting the phase difference between the output of the mixer 272 and the IF signal inputted from the modulator 260, a loop filter 276 for filtering out unwanted signals contained in the output of the phase comparator 274, and a voltage controlled oscillator 278 for generating the RF signal according to the voltage outputted from the loop filter 276. The frequency multiplier 270 is a close loop which functions as a mixer and a filter. Comparing the two transceivers 10 and 20, the use of the frequency multiplier 270 in transceiver 20 can save the high frequency duplexer 102 and the RF filter 172 which are quite expensive.

From the above two transceivers 10 and 20, it can be seen that traditional dual conversion transceivers require at least two oscillators for signal conversions which makes them quite complex and expensive.

SUMMARY OF THE INVENTION

It is therefore a primary objective of the present invention to provide a dual conversion transceiver which requires only one oscillator to simplify system complexity and reduce system cost.

Briefly, in a preferred embodiment, the present invention includes a dual conversion radio frequency transceiver comprising:

an antenna for transmitting and receiving RF signals;
a low noise amplifier for amplifying the received RF signal from the antenna;
a mixer for mixing the amplified RF signal from the low noise amplifier with a first local oscillator signal to generate a first IF (intermediate frequency) signal;
an IF filter for filtering the first IF signal from the mixer;
a local oscillator for providing a second local oscillator signal;
a demodulator for demodulating the filtered first IF signal from the IF filter into first baseband signals by using the second oscillator signal from the local oscillator;
a baseband circuit for processing the first baseband signals from the demodulator and generating second baseband signals to be transmitted;
a modulator for modulating the second baseband signals from the baseband circuit into a second IF signal by using the second local oscillator signal from the local oscillator;
a frequency multiplier for multiplying the frequency of the second IF signal from the modulator by a predetermined factor to generate the transmitting RF signal;
a power amplifier for amplifying the RF signal from the frequency multiplier and passing the amplified RF signal to the antenna;
wherein when the transceiver starts receiving the received RF signal, the baseband circuit will produce a fixed baseband signal, the fixed baseband signal will be modulated into fixed frequency signal by the modulator by using the second local oscillator signal, and the frequency of the fixed frequency signal will be multiplied by the frequency multiplier to generate the first local oscillator signal.

It is an advantage of the present invention that it requires only one local oscillator which makes it much simpler and cheaper less than the traditional dual conversion transceivers described above.

These and other objects and the advantages of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 3:
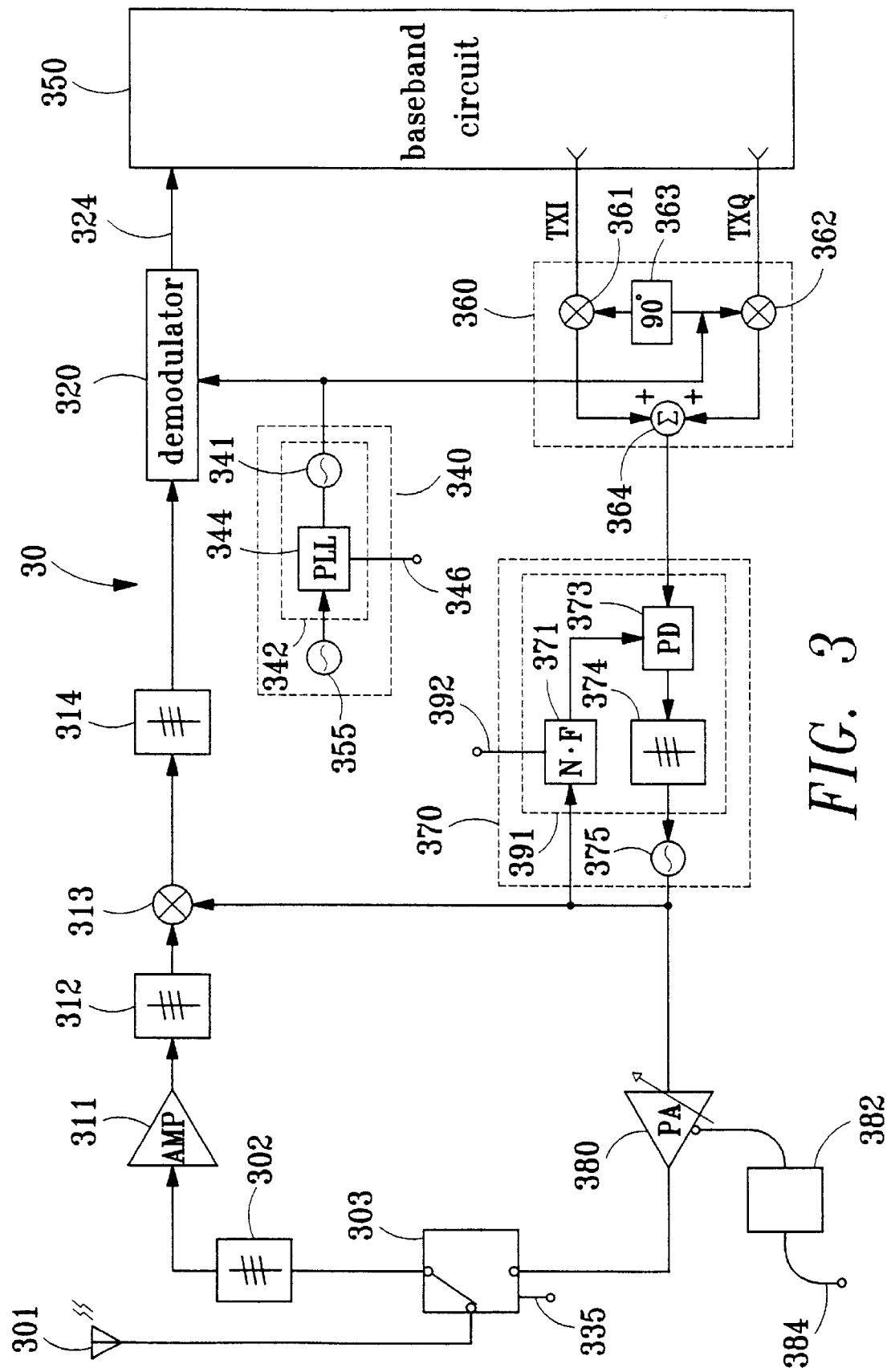
FIG. 3 is a system block diagram of a dual conversion radio frequency transceiver according to the present invention.

Please refer to FIG. 3. FIG. 3 is the system block diagram of a dual conversion radio frequency transceiver 30 according to the present invention. The transceiver 30 comprises an antenna 301 for transmitting and receiving RF signals, a front end circuit 302 for filtering image frequencies and noises out of the received RF signal and for matching impedance between antenna 301 and follow-on circuits, a switch 303 for controlling signal transmitting and receiving according to control signals from port 335, a low noise amplifier (LNA) 311 for amplifying the filtered RF signal from the front end circuit 302, a front end filter 312 for filtering image frequencies and noises out of the amplified RF signal from the low noise amplifier 311, a mixer 313 for mixing the filtered RF signal from the front end filter 312 with a first oscillator signal from frequency multiplier 370 to convert the RF signal into an IF (intermediate frequency) signal, an IF filter 314 for filtering out spurious signals contained in the IF signal which are generated by the mixer 313 in the signal mixing process, and a demodulator 320 for demodulating the filtered IF signal from the IF filter 314 by using a second local oscillator signal from local oscillator 340 into baseband signals which will be outputted over port 324 to a baseband circuit 350 for further internal processing.

The transceiver 30 further comprises a modulator 360 for modulating baseband signals TXI and TXQ from the baseband circuit 350 to be transmitted into an IF signal by using the second local oscillator signal from the local oscillator 340, a frequency multiplier 370 for converting the IF signal from modulator 360 into a RF signal, and a power amplifier 380 for amplifying the RF signal. The amplified RF signal from the power amplifier 380 are passed to the switch 303 and then transmitted by the antenna 301. The transceiver 30 further comprises a control unit (not shown) formed by a microprocessor for controlling signal transmitting and receiving of the transceiver 30.

The local oscillator 340 used for generating the second local oscillator signal comprises a frequency synthesizer 342 and a crystal oscillator 355. The fixed frequency signals generated by the crystal oscillator 355 are used as stable reference signals by the frequency synthesizer 342. The frequency synthesizer 342 comprises a voltage-controlled oscillator (VCO) 341 and a phase-locked loop (PLL) 344. The PLL 344 is used for frequency stabilization and also for frequency switching which is controlled by control signals from port 346 to generate the required second local oscillator signals when transmitting or receiving signals.

The modulator 360 is a conventional I/Q modulator. It comprises a 90 degree phase shifter 363 for shifting the phase of the second local oscillator signal from the local oscillator 340, an I mixer 361 for mixing TXI baseband signal to be transmitted with the output of the phase shifter 363, a Q mixer 362 for mixing the TXQ baseband signal to be transmitted with the second local oscillator signal from the local oscillator 340, and an adder 364 for adding the outputs of the I mixer 361 and Q mixer 362 to generate the IF signal. The baseband signal modulating function performed by the modulator 360 can be expressed by the following modulation equation:

$$\cos(wt+p(t))=\cos(wt)*\cos(p(t))-\sin(wt)*\sin(p(t))$$

where TXI=cos (p(t)), TXQ=sin (p(t)), and w is the phase velocity of the second local oscillator signal generated by the local oscillator 340.

The frequency multiplier 370 comprises a fractional divider 371 for dividing the frequency of the first oscillator signal outputted from the frequency multiplier 370, a phase comparator 373 for detecting the phase difference between the output of the fraction divider 371 and the IF signal inputted from the modulator 360, a loop filter 374 for filtering out unwanted signals generated by the phase comparator 373, and a voltage controlled oscillator 375 for generating the RF signal according to the voltage output of the loop filter 374.

The fractional divider 371 comprises a integral register and a fractional register (not shown) for storing an integer N and a fraction F. The frequency of the IF signal inputted from the modulator 360 is multiplied by a factor N*F when passing through the frequency multiplier 370.

The PLL 344 of the local oscillator 340 is controlled by control signals inputted from port 346 when transmitting or receiving signals. When receiving signals, the control unit will set the TXI baseband signal to a none-zero constant value and set the TXQ baseband signal to zero. According to the modulation equation described above, such settings will fix the frequency of the IF signal generated by the modulator 360. The frequency multiplier 370 will then convert the fixed frequency IF signal to become the first local oscillator signal which is used by the mixer 313 to convert the received RF signal into the IF signal.

The transceiver 30 further comprises a power amplifier controlling circuit 382 for turning on the power amplifier 380 according to control signals from control unit through port 384 when transceiver 30 is transmitting signals, and turning off the power amplifier 380 when transceiver 30 is receiving signals. The switch 303 is also controlled by the control unit through port 335. When receiving signals, the switch 303 connects the antenna 301 to the low noise amplifier 311. And when transmitting signals, it connects the antenna 301 to the power amplifier 380.

Figure 1:
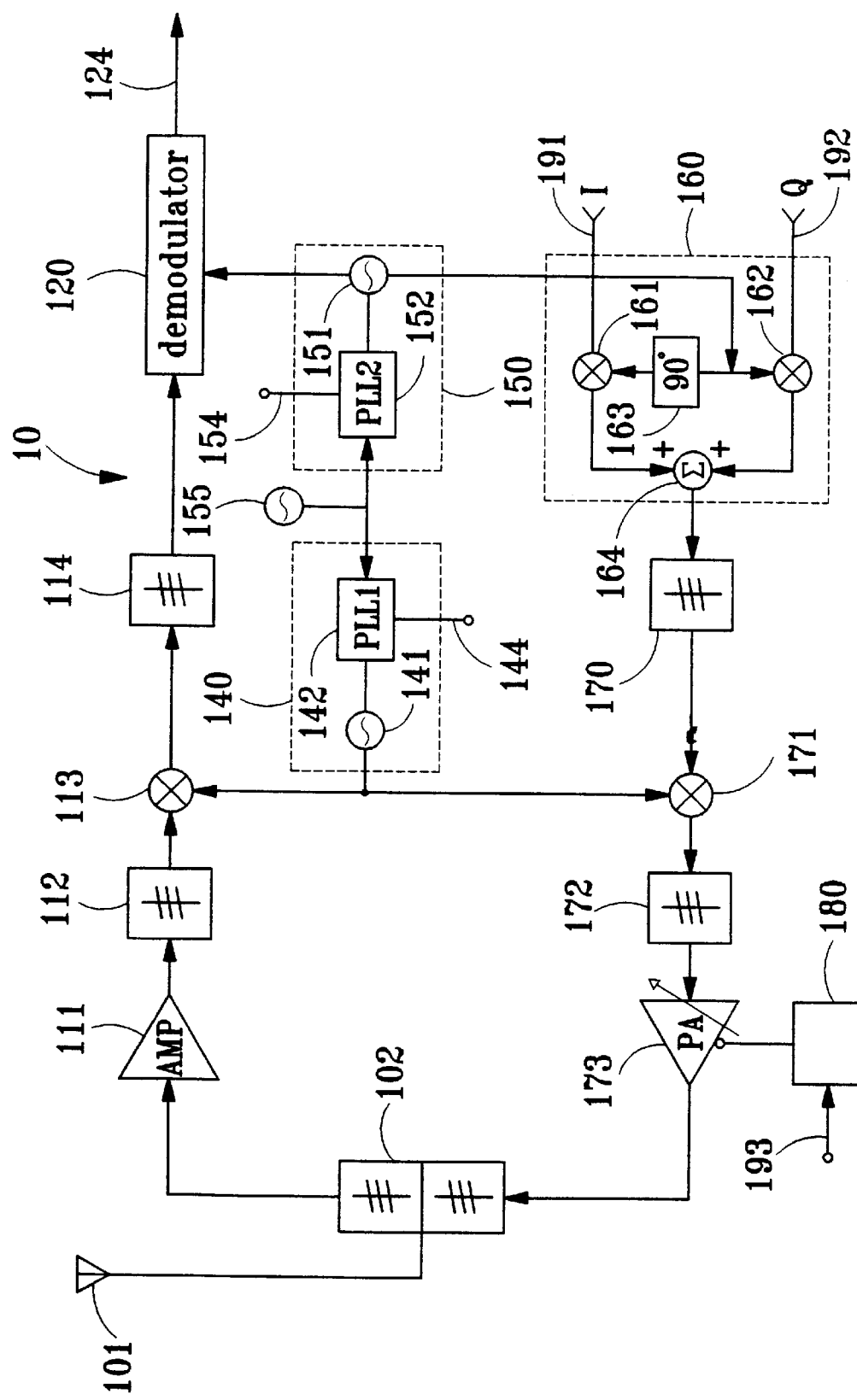
FIG. 1 is a system block diagram of a prior art radio frequency transceiver which comprises two local oscillators.
Figure 2:
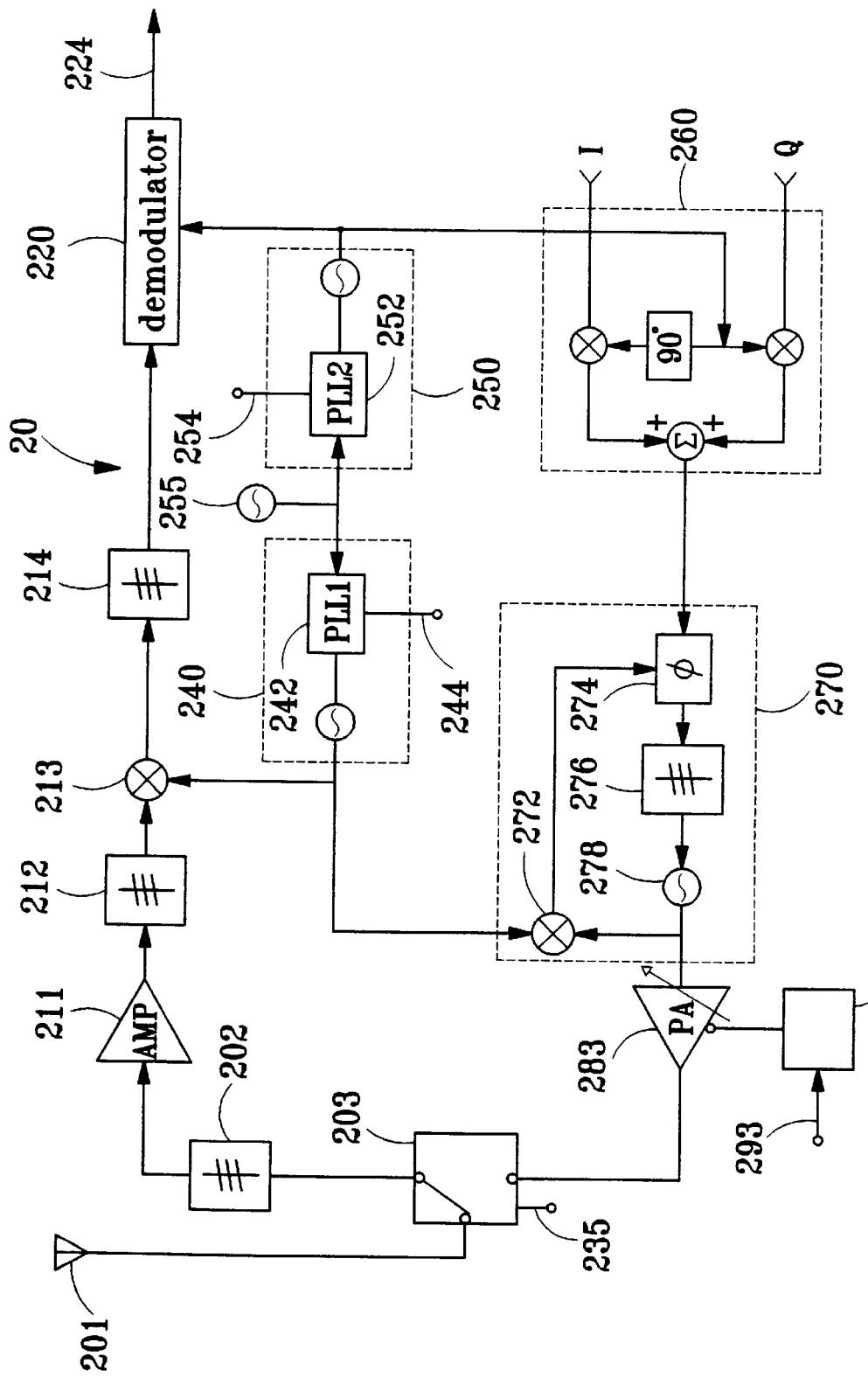
FIG. 2 is a system block diagram of another prior art radio frequency transceiver which comprises two local oscillators.

Compared to the prior art transceiver 10 and 20 shown in FIGS. 1 and 2, the transceiver 30 uses only one local oscillator 340 because the frequency switching between transmitting and receiving signals and the channel selecting functions of the transceiver 30 are performed by the local oscillator 340, modulator 360 and frequency multiplier 370 under the control of the control unit so that only one local oscillator 340 is enough. The structure and cost of the transceiver 30 is thus simpler and cheaper than the transceivers 10 and 20.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A dual conversion radio frequency (RF) transceiver comprising:

an antenna for transmitting and receiving RF signals;

a low noise amplifier for amplifying the received RF signals from the antenna;

a mixer for mixing the amplified RF signals from the low noise amplifier with first local oscillator signals to generate first IF (intermediate frequency) signals;

an IF filter for filtering the first IF signals from the mixer;

a local oscillator for providing second local oscillator signals;

a demodulator for demodulating the filtered first IF signals from the IF filter into first baseband signals by using the second oscillator signals from the local oscillator;

a baseband circuit for processing the first baseband signals from the demodulator and generating second baseband signals comprising I signals and Q signals to be transmitted;

a modulator for modulating the second baseband signals from the baseband circuit into second IF signals by using the second local oscillator signals from the local oscillator, the modulator comprising a phase shifter for converting the second local oscillator signals into 90 degree phase-shifted signals, an I mixer for mixing the I signals with the phase-shifted signals, a Q mixer for mixing the Q signals with the second local oscillator signals, and an adder for adding the outputs from the I and Q mixers to generate the second IF signals;

a frequency multiplier for multiplying the frequency of the second IF signals from the modulator by a predetermined factor to generate RF signals;

a power amplifier for amplifying the RF signals from the frequency multiplier and passing the amplified RF signals to the antenna;

wherein when the transceiver starts receiving the RF signals, the baseband circuit will produce a fixed baseband signal, the fixed baseband signal will be modulated into fixed frequency signals by the modulator by using the second local oscillator signals and setting the I signals of the second baseband signals to a non-zero constant value and setting the Q signals to zero, and the frequency of the fixed frequency signals will be multiplied by the frequency multiplier to generate the first local oscillator signals.

2. The dual conversion RF transceiver of claim 1 wherein the transceiver further comprises a control unit for controlling the local oscillator, the frequency multiplier and the baseband circuit to generate the first local oscillator signal and the second local oscillator signal.

3. The dual conversion RF transceiver of claim 2 wherein the transceiver further comprises a switch controlled by the control unit for connecting the antenna to the low noise amplifier when the transceiver is receiving RF signals, and connecting the antenna to the power amplifier when the transceiver is transmitting RF signals.

4. The dual conversion RF transceiver of claim 2 wherein the transceiver further comprises a power amplifier control circuit controlled by the control unit for turning on and off the power amplifier.

5. The dual conversion RF transceiver of claim 2 wherein the local oscillator comprises a frequency synthesizer which comprises a voltage controlled oscillator and a phase locked loop.

6. The dual conversion RF transceiver of claim 5 wherein the local oscillator further comprises a crystal oscillator circuit for generating a fixed frequency signal which is used as a reference signal by the frequency synthesizer.

7. The dual conversion RF transceiver of claim 1 wherein the frequency multiplier comprises a loop formed by a phase locked loop and a voltage controlled oscillator.

8. The dual conversion RF transceiver of claim 7 wherein the phase locked loop comprises a fractional divider for dividing the frequency of the first oscillator signal outputted from the frequency multiplier, a phase comparator for detecting the phase difference between the output of the fraction divider and the second IF signal inputted from the modulator, a loop filter for filtering out unwanted signals generated by the phase comparator, and a voltage controlled oscillator for generating the RF signal according to the voltage output of the loop filter.

9. The dual conversion RF transceiver of claim 8 wherein the fractional divider includes a integral register for storing a integer number and a fractional register for storing a fraction number.

10. The dual conversion RF transceiver of claim 9 wherein the predetermined factor multiplied by the frequency multiplier is equal to the integer number multiplied by the fraction number.

* * * * *